United States Patent
Marchena Martin-Francés et al.

(10) Patent No.: US 12,351,510 B2
(45) Date of Patent: Jul. 8, 2025

(54) GRAPHENE DOPING BY THERMAL POLING

(71) Applicants: CORNING INCORPORATED, Corning, NY (US); THE INSTITUTE OF PHOTONIC SCIENCES, Barcelona (ES)

(72) Inventors: Miriam Marchena Martin-Francés, Barcelona (ES); Prantik Mazumder, Ithaca, NY (US); Valerio Pruneri, Castelldefels (ES)

(73) Assignees: CORNING INCORPORATED, Corning, NY (US); THE INSTITUTE OF PHOTONIC SCIENCES, Barcelona (ES)

( * ) Notice: Subject to any disclaimer, the term of this patent is extended or adjusted under 35 U.S.C. 154(b) by 896 days.

(21) Appl. No.: 17/285,322

(22) PCT Filed: Oct. 9, 2019

(86) PCT No.: PCT/US2019/055288
§ 371 (c)(1),
(2) Date: Apr. 14, 2021

(87) PCT Pub. No.: WO2020/081306
PCT Pub. Date: Apr. 23, 2020

(65) Prior Publication Data
US 2021/0347689 A1    Nov. 11, 2021

Related U.S. Application Data

(60) Provisional application No. 62/747,219, filed on Oct. 18, 2018.

(51) Int. Cl.
*C03C 23/00*    (2006.01)
*B82Y 30/00*    (2011.01)
(Continued)

(52) U.S. Cl.
CPC .......... *C03C 23/009* (2013.01); *C01B 32/194* (2017.08); *C03C 23/007* (2013.01); *B82Y 30/00* (2013.01); *B82Y 40/00* (2013.01)

(58) Field of Classification Search
CPC . H01L 29/1606; C03C 23/009; C03C 23/007; C01B 32/194; B82Y 30/00; B82Y 40/00
See application file for complete search history.

(56) References Cited

U.S. PATENT DOCUMENTS

2007/0113881 A1* 5/2007 Mellott ................... C03C 17/34
                                                                 65/60.8
2007/0208509 A1    9/2007 Davis et al.
(Continued)

FOREIGN PATENT DOCUMENTS

CN        1821132 A      8/2006
CN      101092290 A     12/2007
(Continued)

OTHER PUBLICATIONS

Paradisi et al., "Space charge induced electrostatic doping of two-dimensional materials: Graphene as a case study", Applied Physics Letters, 107, 143103, 2015 (Year: 2015).*
(Continued)

*Primary Examiner* — Mohsen Ahmadi
*Assistant Examiner* — Christopher A Culbert
(74) *Attorney, Agent, or Firm* — Svetlana Z. Short

(57) ABSTRACT

A method of forming a graphene device includes: providing a glass substrate with a blocking layer disposed thereon to form a stack; providing a first electrode and a second electrode; increasing the temperature of the stack to at least 100° C.; applying an external electric field ($V_P$) to the first electrode such that at least one metal ion of the glass substrate migrates toward the first electrode to create a depletion region in the glass substrate adjacent the second
(Continued)

electrode; decreasing the temperature of the stack to room temperature while applying the external electric field to the first electrode; and after reaching room temperature, setting the external electric field to zero to create a frozen voltage region adjacent the second electrode.

20 Claims, 10 Drawing Sheets

(51) Int. Cl.
  *B82Y 40/00*   (2011.01)
  *C01B 32/194*  (2017.01)

(56) References Cited

U.S. PATENT DOCUMENTS

| | | | | |
|---|---|---|---|---|
| 2011/0030772 | A1* | 2/2011 | Veerasamy | H01L 31/03925 |
| | | | | 174/68.2 |
| 2016/0340226 | A1* | 11/2016 | Dutta | C03C 23/009 |
| 2017/0305787 | A1* | 10/2017 | Gomez | C03C 21/002 |
| 2018/0097281 | A1 | 4/2018 | Grande et al. | |

FOREIGN PATENT DOCUMENTS

| | | | |
|---|---|---|---|
| CN | 102109638 | A | 6/2011 |
| CN | 102656702 | A | 9/2012 |
| CN | 103922591 | A | 7/2014 |
| CN | 105842767 | A | 8/2016 |
| CN | 106449985 | A | 2/2017 |
| CN | 106549100 | A | 3/2017 |
| CN | 107001123 | A | 8/2017 |
| TW | 201133906 | A | 10/2011 |
| TW | 201710199 | A | 3/2017 |
| WO | 2016/187266 | A1 | 11/2016 |

OTHER PUBLICATIONS

Chinese Patent Application No. 201980068866.7, Office Action dated Apr. 20, 2023, 5 pages (English Translation only), Chinese Patent Office.

Taiwanese Patent Application No. 108137000, Office Action dated Jun. 16, 2023, 5 pages (English Translation Only); Taiwanese Patent Office.

A. K. Geim and K. S. Novoselov, "The rise of graphene," Nat. Mater. 6(3), 183-191 (2007).

Choi et al., "Influence of removing PMMA residues on surface of CVD graphene using a contact-mode atomic force microscope," RSC Adv. 7(12), 6943-6949 (2017).

Honglin An and Simon Fleming, "Second-order optical nonlinearity and accompanying near-surface structural modifications in thermally poled soda-lime silicate glasses," J. Optical Society of America B, Nov. 2006, vol. 23, No. 11, pp. 2303-2309.

Kazansky et al., "Thermally poled glass: frozen-in electric field or oriented dipoles?," Optics Communications 110(5), 1994, pp. 611-614.

M. Dussauze et al., "How Does Thermal Poling Affect the Structure of Soda-Lime Glass?," J. Phys. Chem. C 114(29), 12754-12759 (2010).

Mehrer et al., "Diffusion and ionic conduction in oxide glasses," Journal of Physics Conference Series, 106(1), 012001 (2008), pp. 10.

R. A. Myers, N. Mukherjee, and S. R. J. Brueck, "Large second-order nonlinearity in poled fused silica," Optics Letters, vol. 16, No. 22, Nov. 15, 1991, pp. 1732-1734.

Yudistira et al., "Electric surface potential and frozen-in field direct measurements in thermally poled silica," Appl. Phys. Lett. 92(1), 2008, pp. 3.

International Search Report and Written Opinion of the International Searching Authority; PCT/US19/055288; Mailed Jan. 21, 2020; 12 Pages; European Patent Office.

\* cited by examiner

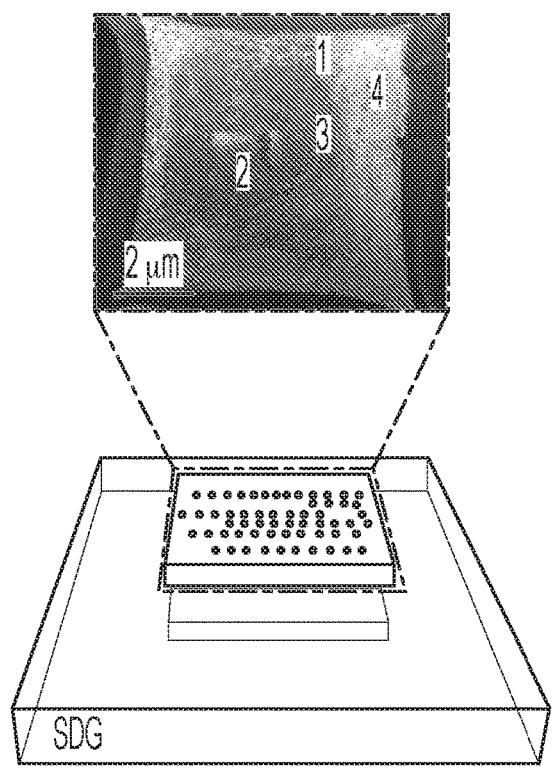
FIG. 6A
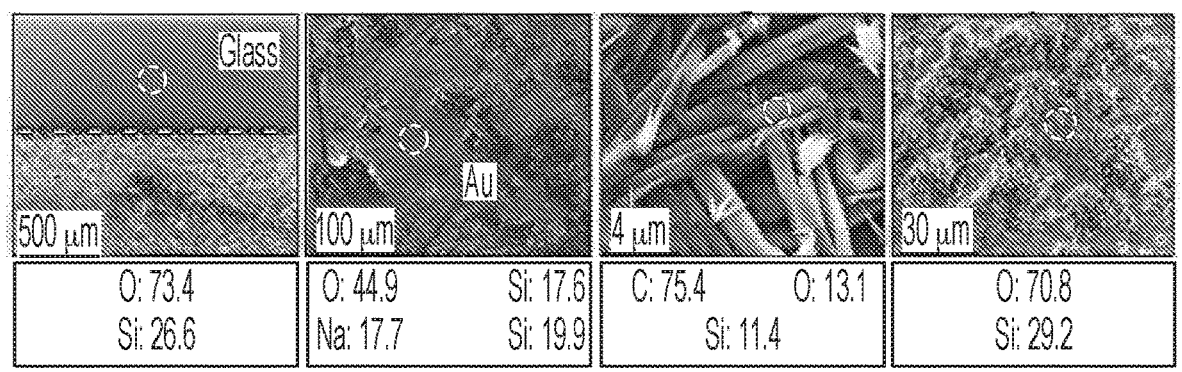
FIG. 6B(1)　FIG. 6B(2)　FIG. 6B(3)　FIG. 6B(4)

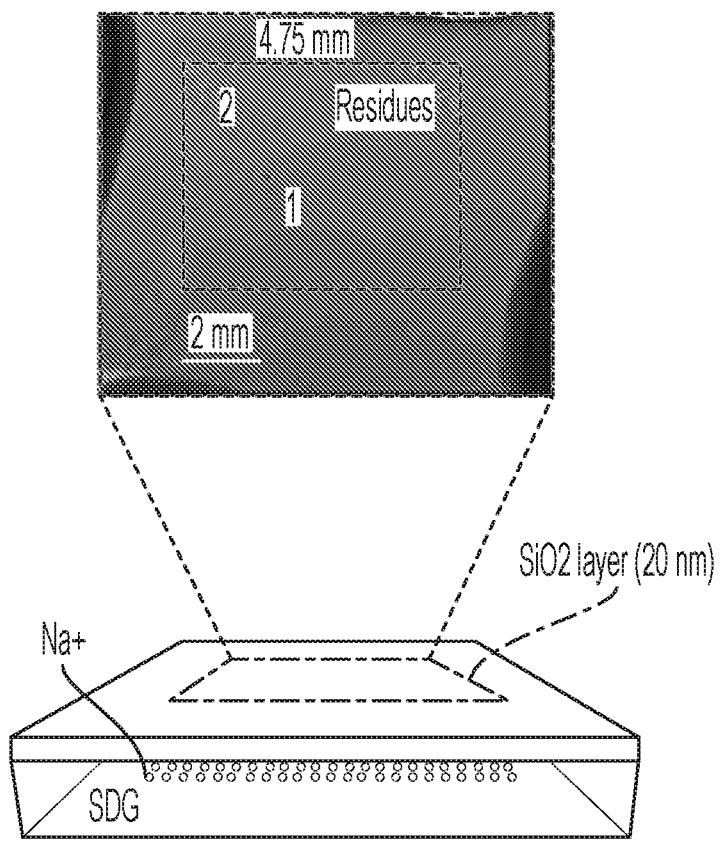
FIG. 8A
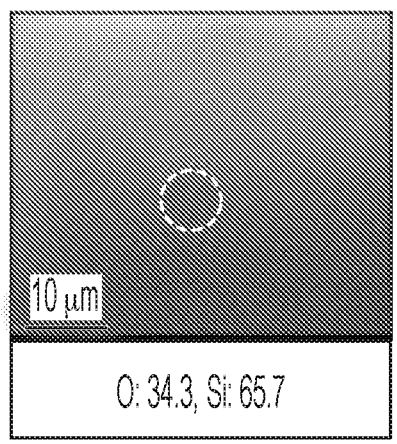
FIG. 8B(1)
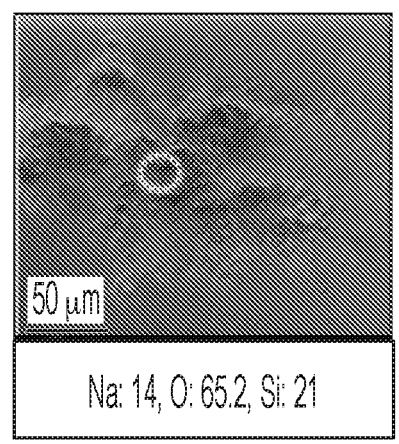
FIG. 8B(2)

GRAPHENE DOPING BY THERMAL POLING

CROSS-REFERENCE TO RELATED APPLICATIONS

This application is a National Stage application under 35 U.S.C. § 371 of International Application No. PCT/US2019/055288, filed on Oct. 9, 2019, which claims the benefit of priority under 35 U.S.C. § 119 of U.S. Provisional Application Ser. No. 62/747,219, filed on Oct. 18, 2018, the contents of both of which are relied upon and incorporated herein by reference in their entirety.

BACKGROUND

1. Field

The disclosure relates to graphene doping by thermal poling and graphene stacked structures formed thereof.

2. Technical Background

Graphene (a two-dimensional monolayer of $sp^2$-bonded carbon atoms) has been garnering interest as a material due to its unique physical properties, such as high intrinsic carrier mobility, tunable band gap, high mechanical strength and elasticity, and superior thermal conductivity. Thus, graphene is promising for many applications, including high-speed transistors, energy/thermal management, chemical/biological sensors, and low-power electronics. As the current generation of silicon-based electronic devices reach their fundamental minimum size limit, graphene offers the possibility of even smaller devices.

Conventional graphene devices often use doped graphene materials to create a bandgap (which is lacking in pristine graphene) and tune Fermi levels. Currently available methods of doping graphene sheets are overly reliant on the substrates upon which the graphene is positioned, and form devices that suffer from low charge carrier density due to low capacitance of the graphene.

This disclosure presents improved graphene stacked structures and methods of fabricating thereof.

SUMMARY

In some embodiments, a method of forming a graphene device, comprises: providing a glass substrate with a blocking layer disposed thereon to form a stack; providing a first electrode and a second electrode; increasing the temperature of the stack to at least 100° C.; applying an external electric potential ($V_{P2}$) to the first electrode such that at least one metal ion of the glass substrate migrates toward the first electrode to create a depletion region in the glass substrate adjacent the second electrode at a potential ($V_{P1}$); decreasing the temperature of the stack to room temperature while applying the external electric potential; and after reaching room temperature, setting the external electric voltage to zero to create a frozen voltage region adjacent the second electrode.

In one aspect, which is combinable with any of the other aspects or embodiments, the stack includes the glass substrate disposed between the blocking layer and at least one graphene layer.

In one aspect, which is combinable with any of the other aspects or embodiments, the first electrode is a cathode electrode, the second electrode is an anode electrode, and the external electric potential is negative.

In one aspect, which is combinable with any of the other aspects or embodiments, the blocking layer is disposed adjacent to the first electrode or adjacent to the second electrode.

In one aspect, which is combinable with any of the other aspects or embodiments, the blocking layer is disposed adjacent to the first electrode and adjacent to the second electrode.

In one aspect, which is combinable with any of the other aspects or embodiments, the at least one graphene layer is an n-type graphene layer.

In one aspect, which is combinable with any of the other aspects or embodiments, the at least one metal ion comprises at least one of sodium ions, calcium ions, lead ions, lithium ions, potassium ions, boron ions, zirconium ions, titanium ions, magnesium ions, aluminum ions, or barium ions, and the step of applying the external electric potential further comprises: reacting the at least one metal ion at the first electrode to form a powder complex.

In one aspect, which is combinable with any of the other aspects or embodiments, the powder complex comprises at least one of $Na_2O$, $Na_2CO_3$, $CaO$, $PbO$, $Li_2O$, $K_2O$, $B_2O_3$, $ZrO_2$, $TiO_2$, $MgO$, $Al_2O_3$, or $BaO$.

In one aspect, which is combinable with any of the other aspects or embodiments, the blocking layer comprises at least one of a $SiO_2$ layer, a hydrophobic coating, a polyimide layer, a self-assembly polymer monolayer, an ion exchanged glass, or combinations thereof.

In one aspect, which is combinable with any of the other aspects or embodiments, a thickness of the blocking layer is in a range of 1 nm to 100 nm.

In one aspect, which is combinable with any of the other aspects or embodiments, a thickness of the depletion region is at least 4 nm.

In one aspect, which is combinable with any of the other aspects or embodiments, the step of applying the external electric potential to the first electrode comprises: increasing a thickness of the depletion region.

In one aspect, which is combinable with any of the other aspects or embodiments, the external electric potential is in a range of 100V to 10 kV.

In one aspect, which is combinable with any of the other aspects or embodiments, the method further comprises: after the step of setting the external electric potential to zero, annealing the stack to eliminate the frozen voltage region.

In one aspect, which is combinable with any of the other aspects or embodiments, the step of increasing the temperature comprises: increasing the temperature of the stack to a range of 100° C. to 300° C.

In one aspect, which is combinable with any of the other aspects or embodiments, the potential ($V_{P1}$) is 0 V.

In some embodiments, a graphene device comprises: a glass substrate with at least one doped graphene layer disposed onto a surface of the glass substrate to form a stack, the glass substrate comprising a frozen voltage region disposed therein and directly adjacent to the surface.

In one aspect, which is combinable with any of the other aspects or embodiments, the at least one doped graphene layer is an n-type graphene layer.

In one aspect, which is combinable with any of the other aspects or embodiments, the at least one doped graphene layer is a p-type graphene layer.

BRIEF DESCRIPTION OF THE DRAWINGS

The disclosure will become more fully understood from the following detailed description, taken in conjunction with the accompanying figures, in which:

FIGS. 6A to 6B(4) illustrate scanning electron microscope (SEM) and energy dispersive x-ray (EDX) measurements performed on a cathode area of a glass substrate, according to some embodiments.

FIGS. 8A to 8B(2) illustrate SEM and EDX measurements performed on a cathode area of a glass substrate, where a blocking layer of 20 nm $SiO_2$ is disposed on the glass substrate, according to some embodiments.

DETAILED DESCRIPTION

Figure 1A:
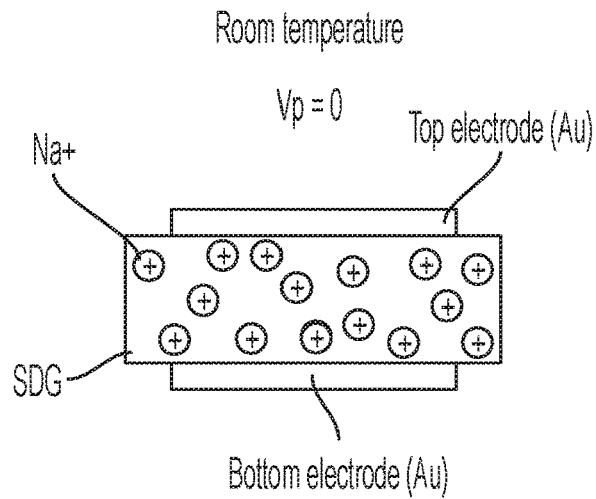
FIGS. 1A to 1C illustrate thermal poling of a glass substrate, according to some embodiments.

Reference will now be made in detail to exemplary embodiments which are illustrated in the accompanying drawings. Whenever possible, the same reference numerals will be used throughout the drawings to refer to the same or like parts. The components in the drawings are not necessarily to scale, emphasis instead being placed upon illustrating the principles of the exemplary embodiments. It should be understood that the present application is not limited to the details or methodology set forth in the description or illustrated in the figures. It should also be understood that the terminology is for the purpose of description only and should not be regarded as limiting.

Additionally, any examples set forth in this specification are illustrative, but not limiting, and merely set forth some of the many possible embodiments of the claimed invention. Other suitable modifications and adaptations of the variety of conditions and parameters normally encountered in the field, and which would be apparent to those skilled in the art, are within the spirit and scope of the disclosure.

Presented herein are methods of electron (n-doping) and hole doping (p-doping) of graphene in a reversible mode by changing polarity of the substrate upon which the graphene device is fabricated. In some embodiments, thermal poling is demonstrated, where two charged layers are created at a predetermined temperature ($T_P$) by ion displacement inside the glass substrate when an external electric potential ($V_P$) is applied. After displacement of the charges, as the system is cooled with continued application of the $V_P$, a frozen-in voltage ($V_{IN}$) is created inside the glass substrate with a value close to $V_P$. This frozen-in voltage is stable over some time period dependent on the glass type and induces a space charge field inside the glass.

Ions inside glasses typically refer to impurities that are introduced during glass synthesis for modifying or optimizing glass properties. These modifiers may be, for example, sodium ($Na_2O$, $Na_2CO_3$, etc.), calcium (CaO), lead (PbO), lithium ($Li_2O$), potassium ($K_2O$), boron ($B_2O_3$), zirconium ($ZrO_2$), titanium ($TiO_2$), magnesium (MgO), aluminum ($Al_2O_3$), or barium (BaO). Without modifiers in quartz or fused silica glasses, strong covalent bonds are created between silicon and oxygen, to thereby provide extremely stable structures. With modifiers (e.g., $Na^+$ in soda lime glass (SDG)), weak ionic bonds are created as the modifier promotes breakage of some Si—O—Si bridges during synthesis, to facilitate ion mobility through the non-bridged oxygens in the glass network at temperatures much lower than the glass transition temperature. As a result, the non-bridged oxygens are anions ($O^-$) for the sodium cations ($Na^+$) and NaO is incorporated at these non-bridged locations. Similar mechanisms of incorporation are analogous for other modifiers as mentioned above.

Figure 1B:
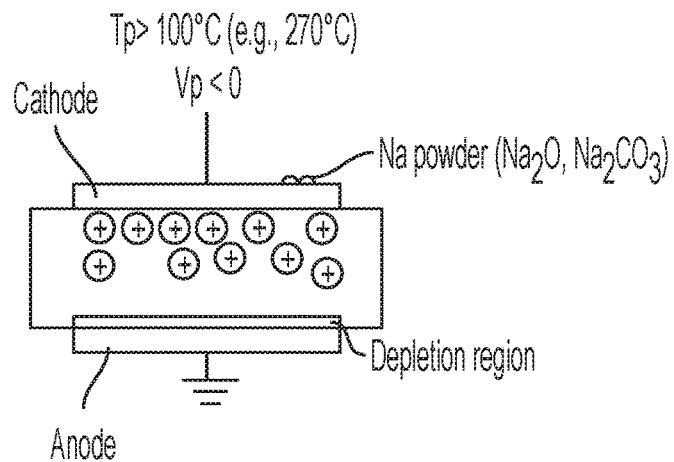
Figure 1C:
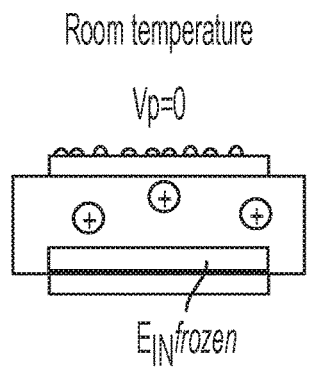

Referring now to FIGS. 1A to 1C, which illustrate thermal poling of a glass substrate (e.g., SDG) comprising sodium modifiers, according to some embodiments.

At room temperature (RT) (FIG. 1A), $Na^+$ charges are distributed randomly along a cross-section of the whole SDG substrate. As temperature is increased (e.g., above 100° C. or above 250° C.) and an external electric potential ($V_P$) is applied to a first electrode (e.g., cathode) (FIG. 1B), the $Na^+$ ions migrate, or drift, to the first electrode where they are neutralized by forming a powder complex. For example, at temperatures above about 100° C., the ionic mobility of $Na^+$ is activated and causes the drift of ions towards the negative electrode (cathode) where they are neutralized by electrons injecting through the electrodes (due to the applied voltage), negative $OH^-$ residues when the electrode is not blocking for water or other chemical compounds on the surface of the glass. The nature of the movement is based on thermal agitation (increase temperature) and the potential differences across the glass substrate. This diffusion mechanism of positively charged metal ions is one example in glasses where silicon vacancies in the SDG substrate enhance the flux of $Na^+$, which drifts towards the cathode leaving a vacancy that will be occupied by another $Na^+$.

At the same time, a negative depletion region is created and progressively increases in thickness adjacent to a second electrode (e.g., anode). The negative depletion region acquires a net negative charge from positive $Na^+$ ions exiting the region and drifting toward the first electrode. The progressive increase in the thickness of the depletion region may produce an increase in the potential difference (voltage) across the depletion region and a decrease in the potential difference (voltage) across the rest of the bulk of the glass. This process slows down with the reduction of voltage across the rest of the bulk and becomes stationary (i.e., an equilibrium and maximum poling are achieved) when the voltage is almost totally across the depletion region and equal to the external applied voltage.

As greater amounts of ions accumulate at the cathode, greater amounts of powder complexes form on the cathode, thereby removing the modifiers from the glass substrate. Thereafter, the $V_P$ is set to zero once the system reacquires room temperature (i.e., $V_P$ is maintained during the cool down process) and a frozen voltage region is formed (FIG. 1C).

The frozen voltage region is the region of the glass substrate which is the final thickness of the depletion region. In other words, during application of the external electric potential, the thickness of the depletion region increases to at least 0.25 µm, or at least 0.50 µm, or at least 0.75 µm, or at least 1.0 µm, or at least 1.5 µm, or at least 2.0 µm, or at least 2.5 µm, or at least 3.0 µm, or at least 3.5 µm, or at least 4.0 µm, or at least 4.5 µm, or at least 5.0 µm, or at least 7.5 µm, or at least 10.0 µm. The frozen voltage region is where an electric field ($V_{IN}$) is frozen inside the glass. In other words, the depletion region remains because the ions have lost their mobility and remain displaced inside the glass, thereby creating a permanent internal electric field $V_{IN}$.

In some examples, a negative $V_P$ is applied, as is seen in FIGS. 1A to 1C. In some examples, where a positive $V_P$ is applied, a similar phenomenon is observed where ions drift toward the cathode. In either case ($\pm V_P$), the displacement of charges along the glass propagates, creating an ion current which, upon arriving at the cathode, neutralize into, e.g. metallic sodium, $Na_2CO_3$, or $Na_2O$ (in the case of sodium modifiers), which then deposit at the cathode-glass interface as a powder complex. Due to this migration and the absence of replacement ions in the region adjacent the anode electrode, a depletion region with negative charge is created, typically being several microns in thickness.

In some examples, the external electric field has a voltage $V_P$ in a range of 0.1 kV to 4.0 kV, or in a range of 0.25 kV to 3.5 kV, or in a range of 0.5 kV to 3.0 kV, or in a range of 0.75 kV to 2.5 kV, or in a range of 1.0 kV to 2.0 kV, or in a range of 1.25 kV to 1.75 kV. In some examples, the external electric field has a voltage $V_P$ of 0.1 kV, or 0.2 kV, or 0.3 kV, or 0.4 kV, or 0.5 kV, or 0.6 kV, or 0.7 kV, or 0.8 kV, or 0.9 kV, or 1.0 kV, or 1.1 kV, or 1.2 kV, or 1.3 kV, or 1.4 kV, or 1.5 kV, or 1.6 kV, or 1.7 kV, or 1.8 kV, or 1.9 kV, or 2.0 kV, or 2.1 kV, or 2.2 kV, or 2.3 kV, or 2.4 kV, or 2.5 kV, or 2.6 kV, or 2.7 kV, or 2.8 kV, or 2.9 kV, or 3.0 kV, or 3.1 kV, or 3.2 kV, or 3.3 kV, or 3.4 kV, or 3.5 kV, or 3.6 kV, or 3.7 kV, or 3.8 kV, or 3.9 kV, or 4.0 kV, or any value therebetween. At these ranges of voltages (especially below 4.0 kV), high ion currents are avoided even at high concentrations of metal ions (e.g., $Na^+$) that would cause thermal runaway and electric breakdown through soda lime or other high ionic content glasses.

In some examples, the external electric field has a voltage $V_P$ in a range of 4.0 kV to 10.0 kV, or in a range of 5.0 kV to 9.0 kV, or in a range of 6.0 kV to 8.0 kV, or in a range of 6.5 kV to 7.5 kV, or in a range of 6.75 kV to 7.25 kV. In some examples, the external electric field has a voltage $V_P$ of 4.0 kV, or 4.1 kV, or 4.2 kV, or 4.3 kV, or 4.4 kV, or 4.5 kV, or 4.6 kV, or 4.7 kV, or 4.8 kV, or 4.9 kV, or 5.0 kV, or 5.1 kV, or 5.2 kV, or 5.3 kV, or 5.4 kV, or 5.5 kV, or 5.6 kV, or 5.7 kV, or 5.8 kV, or 5.9 kV, or 6.0 kV, or 6.1 kV, or 6.2 kV, or 6.3 kV, or 6.4 kV, or 6.5 kV, or 6.6 kV, or 6.7 kV, or 6.8 kV, or 6.9 kV, or 7.0 kV, or 7.1 kV, or 7.2 kV, or 7.3 kV, or 7.4 kV, or 7.5 kV, or 7.6 kV, or 7.7 kV, or 7.8 kV, 7.9 kV, 8.0 kV, 8.1 kV, 8.2 kV, 8.3 kV, 8.4 kV, 8.5 kV, 8.6 kV, 8.7 kV, 8.8 kV, 8.9 kV, 9.0 kV, 9.1 kV, 9.2 kV, 9.3 kV, 9.4 kV, 9.5 kV, 9.6 kV, 9.7 kV, 9.8 kV, 9.9 kV, 10.0 kV, or any value there between. At these ranges of voltages (especially below 10.0 kV), high ion currents are avoided even at high concentrations of metal ions (e.g., $Na^+$) that would cause thermal runaway and electric breakdown through fused silica from natural quartz or other low ionic content glasses.

Figure 2A:
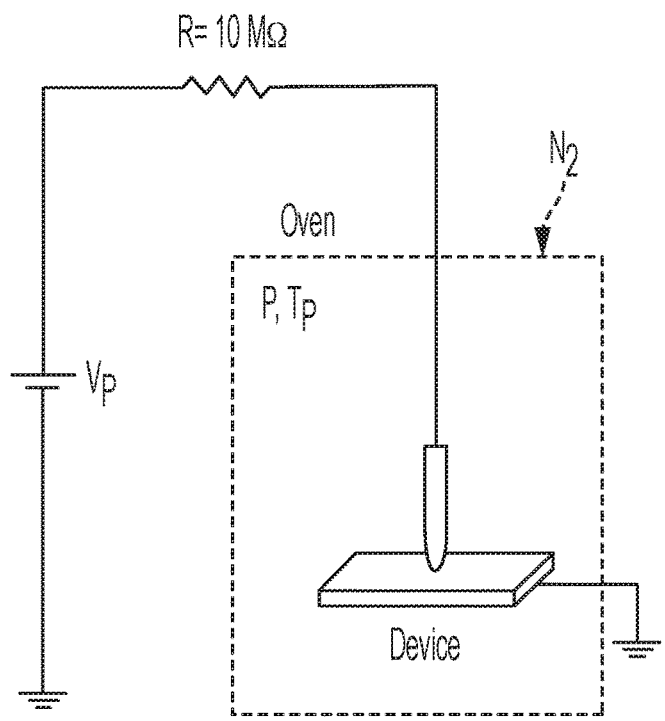
FIGS. 2A and 2B illustrate a thermal poling experimental setup, according to some embodiments.
Figure 2B:
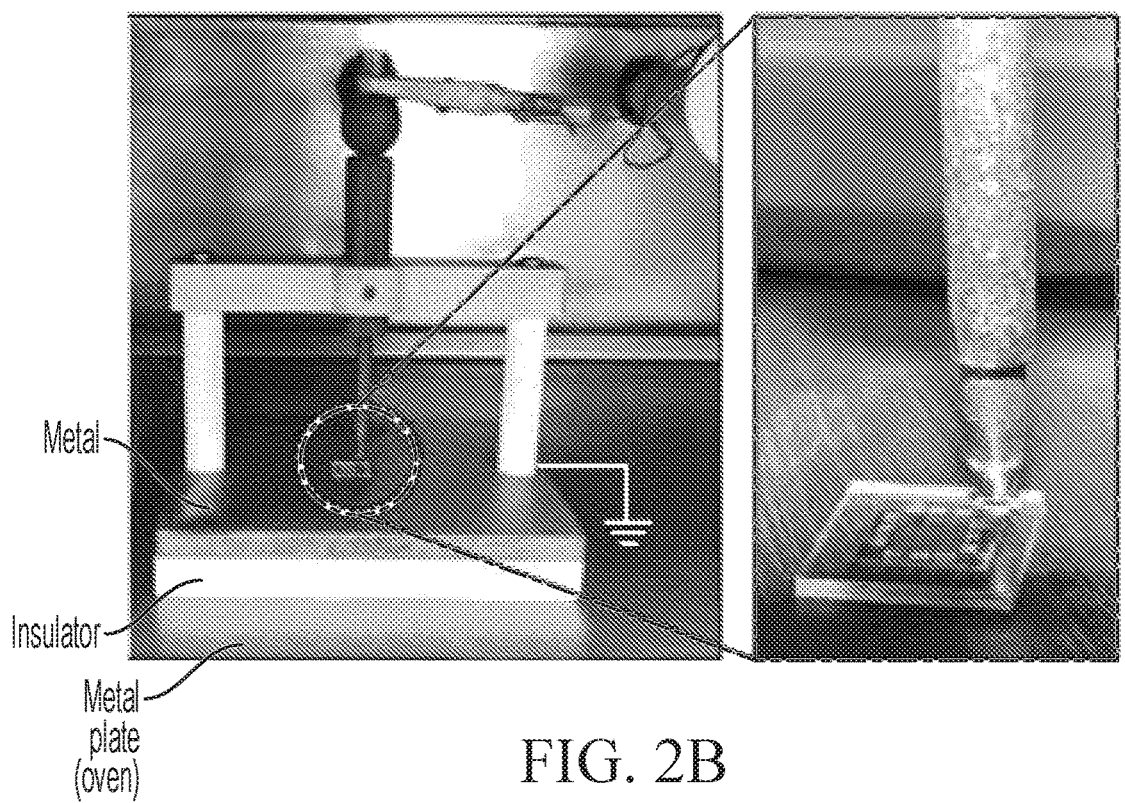

Referring now to FIGS. 2A and 2B, which illustrate a thermal poling experimental setup, according to some embodiments. Specifically, FIG. 2A describes an electric circuit where $V_P$ is applied to a sample located inside an oven under predetermined pressure and temperature conditions. FIG. 2B shows an optical image internal to the oven where the glass substrate is connected to the voltage supply ($V_P$). A cable from outside the oven connected to an external DC supply is attached to a metallic tip that applies $V_P$ to the graphene device through a gold (Au) electrode. The enlarged image of FIG. 2B shows the connection between the tip and the Au contact of the graphene device.

Figure 3A:
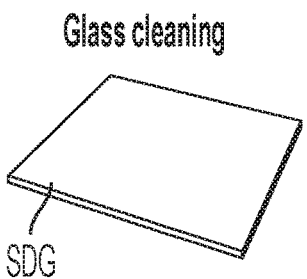
FIGS. 3A to 3E illustrate process steps for fabrication of a graphene device, according to some embodiments.
Figure 3B:
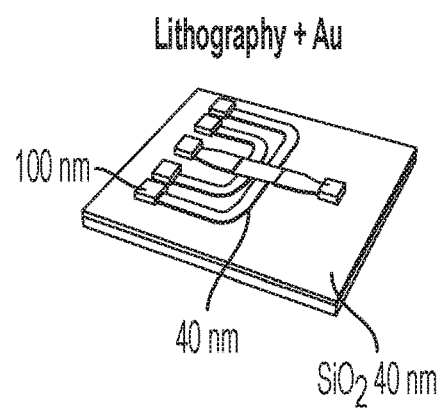

Referring now to FIGS. 3A to 3E, which illustrate process steps for fabrication of a graphene device, according to some embodiments. Initially, a glass substrate (e.g., SDG) is provided and cleaned by organic solvents and/or plasma etching (e.g., $O_2$, Ar, etc.) (FIG. 3A). Thereafter, a blocking layer is deposited on top of the glass (e.g., 20 nm of $SiO_2$ by sputtering), followed by a pair of UV lithography and evaporation steps to form metal contacts, a first patterning process may be conducted to form Hall bar geometry and a second patterning process may be conducted to increase the thickness of Au contacts (i.e., anode electrode) (FIG. 3B). The first patterning process may be used to deposit a first and/or a second metal contact, with the first metal contact having a thickness in a range of 1 nm to 20 nm (e.g., 2 nm) and the second metal contact having a thickness in a range of 10 nm to 100 nm (e.g., 40 nm). The blocking layer may have a thickness in a range of 1 nm to 100 nm, or in a range of 5 nm to 75 nm, or in a range of 10 nm to 60 nm, or in a range of 15 nm to 50 nm. In some examples, the blocking layer may have a thickness of 1 nm, or 2 nm, or 5 nm, or 10 nm, or 15 nm, or 20 nm, or 25 nm, or 30 nm, or 35 nm, or 40 nm, or 45 nm, or 50 nm, or 55 nm, or 60 nm, or 65 nm, or 70 nm, or 75 nm, or 80 nm, or 85 nm, or 90 nm, or 95 nm, or 100 nm, or any value therebetween. In some examples, the blocking layer may be at least one of an $Al_2O_3$ layer, an $SiO_2$ layer, a hydrophobic coating, ion exchanged glass, or combinations thereof.

A Hall conductor may have a positional geometry whereby a current propagates in an x-direction of the bar and a magnetic field B in the y-direction. Due to Lorentz forces, charged particles moving in the x-direction will be deflected in the ±z-direction depending on their charge. This causes a buildup of charge on one side of the bar, measurable as the Hall voltage ($V_H$) across the bar.

Figure 3C:
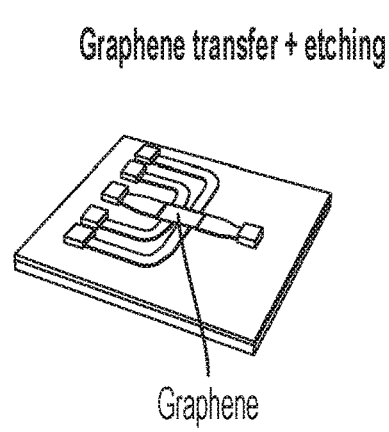
Figure 3D:
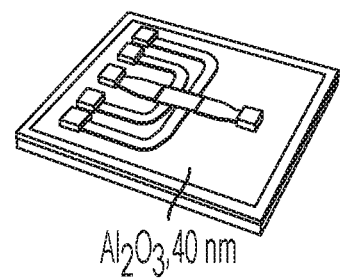

In FIG. 3C, graphene sheet(s) are transferred by wet etching, then post-annealed to remove PMMA residues, and a third lithography step is performed to pattern the graphene onto the Hall bar area, with the exposed area being removed by etching processes (e.g., reactive ion etching (RIE) using an $O_2$ plasma). Thereafter, the device is encapsulated by depositing a dielectric on top (e.g., $Al_2O_3$, $SiO_2$, etc.) via vapor deposition (e.g., atomic layer deposition (ALD), chemical vapor deposition (CVD)) (FIG. 3D), with a thickness in a range of 1 nm to 100 nm, or in a range of 5 nm to 75 nm, or in a range of 10 nm to 60 nm, or in a range of 15 nm to 50 nm. In some examples, the blocking layer may have a thickness of 1 nm, or 2 nm, or 5 nm, or 10 nm, or 15 nm, or 20 nm, or 25 nm, or 30 nm, or 35 nm, or 40 nm, or 45 nm, or 50 nm, or 55 nm, or 60 nm, or 65 nm, or 70 nm, or 75 nm, or 80 nm, or 85 nm, or 90 nm, or 95 nm, or 100 nm, or any value therebetween. This dielectric layer prevents direct contact of graphene with the atmosphere, thereby allowing a stable doping during the electrical measurements (i.e., graphene doping may be altered with humidity and presence of oxygen). Then, a fourth lithography step is performed to remove $Al_2O_3$ from the Au contacts by dipping the samples into a BOE solution.

Figure 3E:
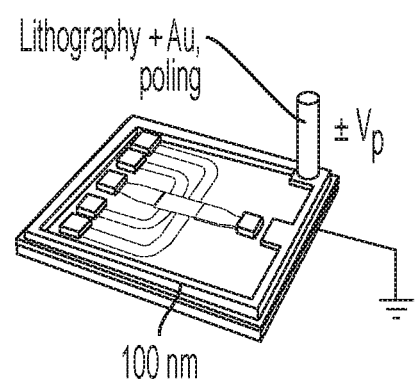

Finally, FIG. 3E shows a fifth lithography process to evaporate a second Au contact (i.e., cathode electrode when a negative voltage is applied) that will serve to apply the $V_P$ with the poling set-up of FIGS. 2A and 2B (in subsequently performed electrical measurements, the second Au electrode (or, at least, the small connections that contact it to the device) needs to be removed using an Au etchant).

Thermal poling may then be conducted as described above in FIGS. 1A to 1C. In some examples, the thermal poling procedure may be performed at a temperature of at least 270° C. (e.g., see FIG. 1B), at an applied external electric field ($V_P$) of ±1.4 kV to 1.6 kV, and for a time ($t_P$)

in a range of 1 hr to 5 hrs, depending on the doping level desired in the graphene. Electrical measurements may be performed to obtain square resistance ($R_S$), carrier density ($n_S$), and mobility ($\mu_H$).

Thus, with the thermal technique described above, it is shown that altering polarity of the glass substrates by applying positive and negative $V_P$ changes graphene doping into p- and n-type, respectively.

In some examples, after the step of setting the external electric field to zero (e.g., FIG. 1C), a post-annealing step may be performed to the poled device to progressively erase the poling (i.e., to eliminate the frozen voltage region), thereby modifying $n_S$ until a change of doping is achieved. This demonstrates a reversible poling effect. To this end, and after the initial electrical characterization determining polling effects, Hall measurements were performed combined with multiple probe, in situ monitoring of the $R_S$, to evaluate the change in $n_S$ of the poled samples (i.e., pre-annealing) and those after poling effects have been erased (post-annealing). Thus, simultaneous measurement of $R_S$, $n_S$, and $\mu_H$ are obtained over time as temperature is progressively applied to illustrate the difference between samples with having the poling effect (as shown, for example, in FIGS. 1A to 1C) and samples without poling the poling effect as it is gradually erased in the post-annealing.

EXAMPLES

The embodiments described herein will be further clarified by the following examples.

Figure 4A:
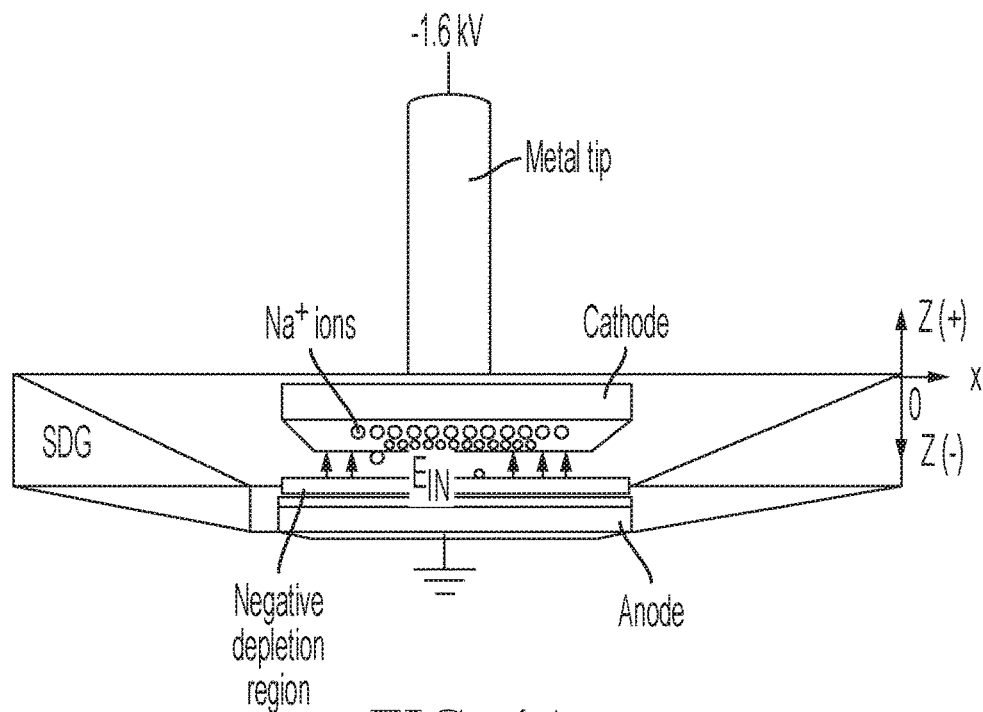
FIGS. 4A and 4B illustrate a thermal poling schematic showing $Na^+$ drift and associated Raman spectroscopy data, according to some embodiments.
Figure 4B:
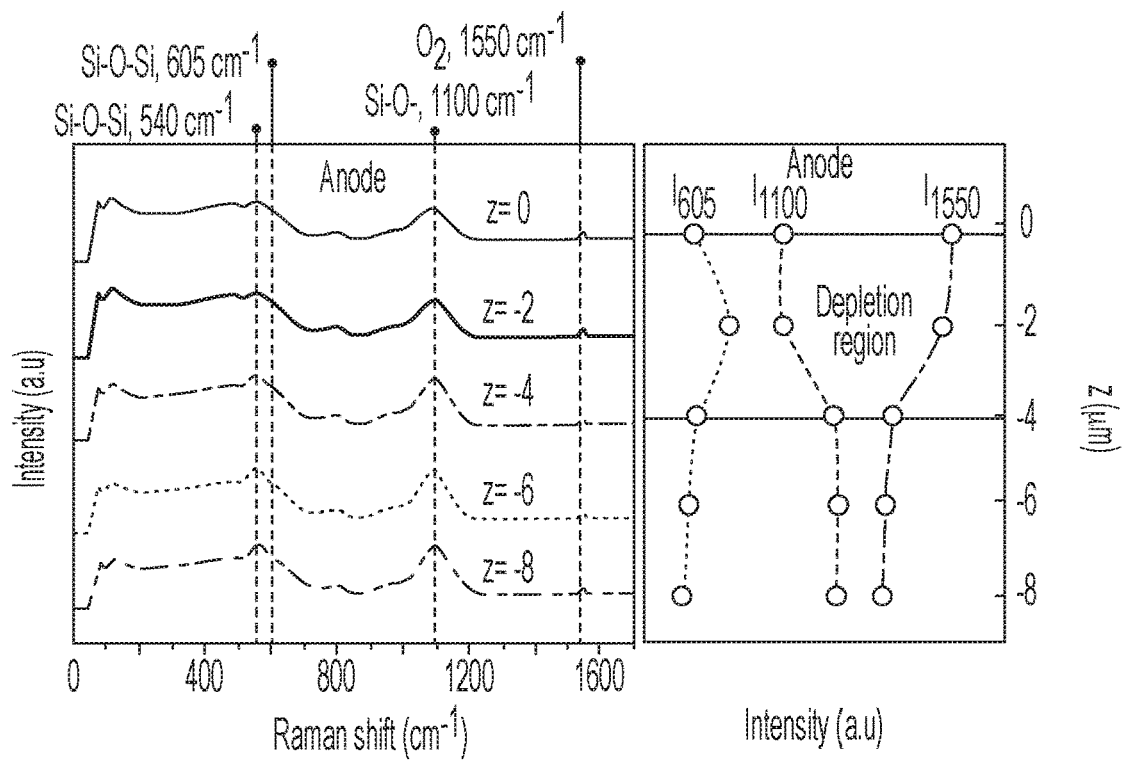

Initially, thermal poling was performed and characterized on SDG glass substrates. FIGS. 4A and 4B illustrate a thermal poling schematic showing $Na^+$ drift and associated Raman spectroscopy data, according to some embodiments. Thermal poling of the SDG substrate was conducted at 270° C., with an applied external electric field $V_P$ of −1.6 kV for 5 hours. Two gold electrodes (50 nm thickness) and a titanium adhesion layer (2 nm) are evaporated onto both faces of the glass substrate to enhance formation of a homogeneous electric field inside the glass. FIG. 4A shows drifting of $Na^+$ charges towards the cathode (top side of the glass) as $V_P$ is applied (arrows) to create a negative depletion region on the bottom side of the substrate close to the anode. If a positive $V_P$ were applied, $Na^+$ charges would drift in the opposite direction, towards the cathodic bottom side of the glass, with the depletion region being created at the anodic top side.

The poling effect on glass may be detected by Raman spectroscopy and allows experimental measurement of the depletion region thickness. Typically, SDG glass exhibits two peaks in Raman data, with the first one occurring at 540 $cm^{-1}$ with a broad shoulder at around 450 $cm^{-1}$. Both these peaks are related to the stretching and bending vibrational modes of Si—O—Si bridges in the glass. The second typical peak for SDG glass is detected at 1100 $cm^{-1}$, which is related to the non-bridging bonds Si—$O^-$. After thermal poling, Raman measurement on the anodic face of the glass (corresponding to the side where the depletion region has been created, closest to the anode), provides different spectra when it is measured exactly at the poled surface (i.e., z=0) and when it is measured progressively deeper into the glass. In the latter case, it is measured in steps of 2 µm, up to a maximum distance of 8 µm (i.e., z=−8 µm), where the typical Raman spectra of non-poled SDG is observed. For example, FIG. 4B shows Raman spectroscopy data of measurements conducted at the anode surface measuring from the poled surface (z=0) to a distance 8 µm inside the glass (z=−8 µm). Poling is confirmed by the two weak peaks at 605 $cm^{-1}$ and 1550 $cm^{-1}$, with the latter being indicative of a depletion region, as it relates to the non-bridged oxygen in the matrix from where $Na^+$ has been removed. The disappearance of both peaks when measuring deeper into the glass confirms a depletion region thickness of about 4 µm.

When Raman is conducted on the poled surface of the SDG glass (i.e., anodic face), lower intensities of the peaks at 540 $cm^{-1}$ and 1100 $cm^{-1}$ are observed and there is a wider shoulder of Si—O—Si stretching-bending bands, with a tiny peak at 490 $cm^{-1}$. However, the most determinant peak to confirm the poling effect is the weak shoulder appearing at 605 $cm^{-1}$. Combined with the peak at 490 $cm^{-1}$, these may be attributed to the symmetric stretching vibration of Si—O—Si bridges in three and four-member rings of $SiO_4$ tetrahedron, respectively. Moreover, as stated previously, a weak peak appears at 1550 $cm^{-1}$, which is exclusively in the depletion region and is related to non-bridged oxygen in the glass matrix.

When Raman is conducted deeper in the SDG glass, both peaks at 605 $cm^{-1}$ and 1550 $cm^{-1}$ are detectable until approximately z=−4 µm. This is observed in the right panel of FIG. 4B, where the intensities of the peaks at 605 $cm^{-1}$, 1100 $cm^{-1}$, and 1550 $cm^{-1}$ have been plotted at the different heights in glass. As previously stated, the intensity peaks at 605 $cm^{-1}$ and 1550 $cm^{-1}$ are high, but decrease at 4 µm. This translates into an experimental measurement of a depletion region thickness of about 4 µm.

Figure 5A:
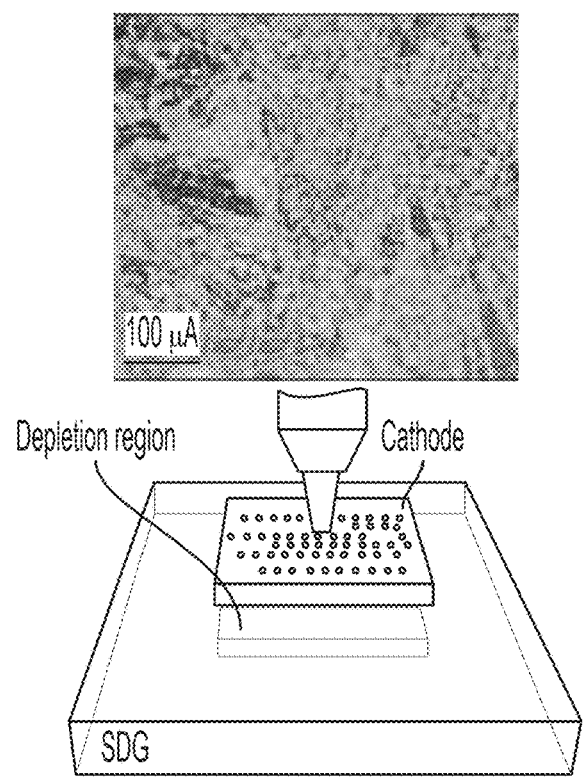
FIGS. 5A and 5B illustrate $Na_2CO_3$ formation at a cathode after thermal poling of a glass substrate, according to some embodiments.
Figure 5B:
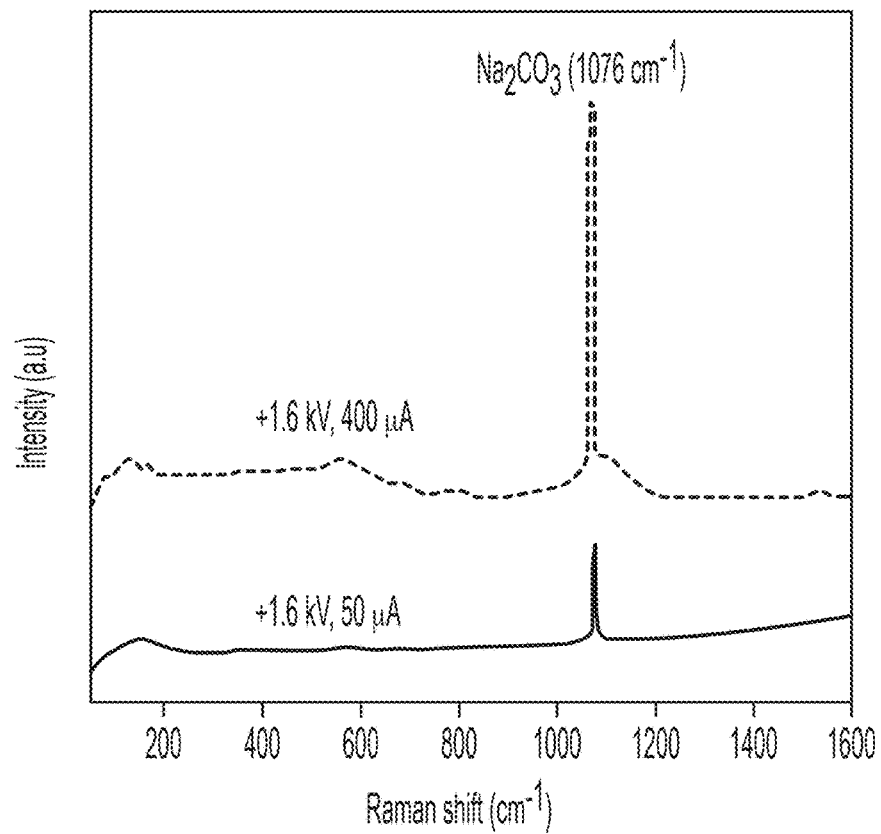

Thermal poling of SDG glass is also visually confirmed by a powder complex deposition on the cathode, even if current is limited when the graphene is added. For example, FIGS. 5A and 5B illustrate $Na_2CO_3$ formation at a cathode after thermal poling of a glass substrate, according to some embodiments. FIG. 5A illustrates an optical microscope image of the cathode showing particles, which correspond to $Na^+$ charges that have been neutralized into $Na_2CO_3$ by reaction of $Na^+$ with $CO_2$, and damaged areas. The bottom scheme of FIG. 5A shows the cathode face where the optical image was obtained and where Raman data in FIG. 5B was measured. The depletion region that forms close to the anodic face (bottom) of the SDG glass is shown.

For the poled SDG glass substrate of FIGS. 4A and 4B, Raman spectroscopy data was collected on the powder complexes deposited on the cathode side of the glass. The Raman data shown in FIG. 5B shows the presence of $Na_2CO_3$ by an intense and narrow peak at 1076 $cm^{-1}$ for both the samples where the current was not limited (top) and the samples where the current was limited to 50 µA.

In some examples, a graphene device may be built on the cathode face of the glass substrate to take advantage of the highly positive charges accumulating close to the surface, which are retained by the presence of at least one blocking layer. When the glass substrate is poled without at least one blocking layer, sodium reacts to form $Na_2CO_3$ (if graphene does not completely block $CO_2$) and $Na_2O$ (oxidation), which may damage the at least one graphene layer.

FIGS. 6A to 6B(4) illustrate scanning electron microscope (SEM) and energy dispersive x-ray (EDX) measurements performed on a cathode area of a glass substrate, according to some embodiments. FIG. 6A illustrates an overall SEM optical microscope image of SDG poled area of the cathode (without graphene present) showing the locations of four positions where SEM and EDX data was collected. The bottom scheme of FIG. 6A shows the cathode face where the optical image was obtained.

FIGS. 6B(1) to 6B(4) reveal a non-homogeneous surface, where the formation of compounds with Na are detected.

The image of FIG. 6B(1) is close to the edge of the Au electrode and shows a large difference between the poled and non-poled regions. EDX measurement on the non-poled area, denoted by a circled-dashed line, confirm that only Si and O belong to the substrate. The image of FIG. 6B(2) is closer to the center of the cathode and shows formation of compounds that have been passed through the Au electrode. EDX measurements detect the substrate contribution, but also Au (belonging to the electrode), and Na. The presence of sodium demonstrates neutralization of the charges on the cathode. The images of FIGS. 6B(3) and 6B(4) reveal formation of two specific compounds of Na, which according to EDX measurements, may be related to $Na_2CO_3$ and $Na_2O$, as they have similar shapes to $CaCO_3$ and ZnO, respectively. In both cases, the Na is detected when measuring on the formed compounds, but the Si of the substrate, is not detected. This confirms Na compounds are formed on the cathode surface.

Figure 7A:
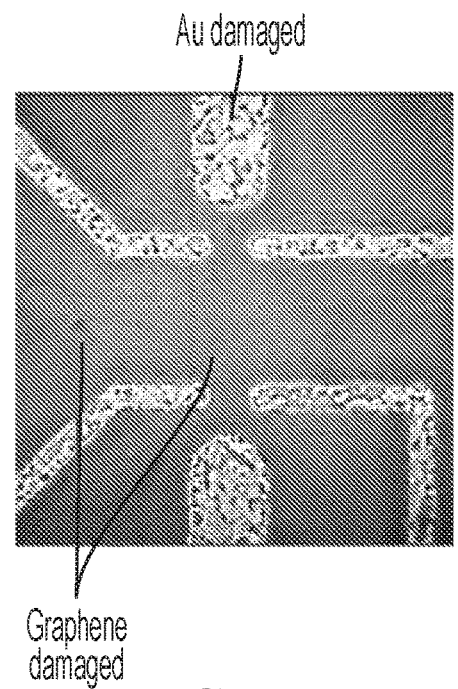
FIGS. 7A and 7B illustrate thermal poling of a graphene device without current limitation, according to some embodiments.
Figure 7B:
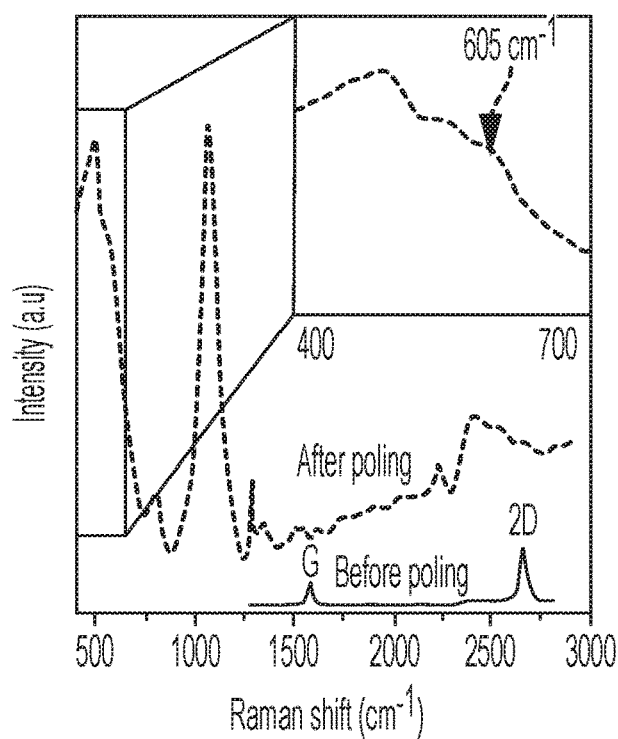

FIGS. 7A and 7B illustrate thermal poling of a graphene device at $V_P$ of +1.6 kV without current limitation, according to some embodiments. Specifically, FIG. 7A illustrates an optical image of the Hall bar of a graphene device with damaged Au contacts and graphene layer after thermal poling the glass substrate without any current limitation and applying a positive voltage (i.e., with graphene being the anode). The damage to the graphene after poling is confirmed by Raman data in FIG. 7B. After poling, the detection of the peak at 605 $cm^{-1}$, and the absence of typical G and 2D graphene peaks (which are detected before poling) confirm the damage to the graphene device and the need to control current.

FIGS. 8A to 8B(2) illustrate SEM and EDX measurements performed on a cathode area of a glass substrate, according to some embodiments. Unlike FIGS. 6A to 6B(4), the images of FIGS. 8A to 8B(2) are in cases where a blocking layer (e.g., 20 nm of $SiO_2$) is added to the cathode surface. FIG. 8A illustrates an overall SEM optical microscope image of SDG poled area of the cathode (with a blocking layer present) showing the locations of two positions where SEM and EDX data was collected. The bottom scheme of FIG. 8A shows the cathode face where the optical image was obtained.

FIGS. 8B(1) and 8B(2) reveal a non-homogeneous surface, where the formation of compounds with Na are detected. The image of FIG. 8B(1), which spans almost the entire poled region, reveals a clean surface without the presence of Na compounds. EDX measurement also confirms the retention of Na inside the glass as it could not be detected (i.e., it is not reacting at the cathode surface). The image of FIG. 8B(2) is close to the top edges and reveals the formation of small Na compounds, as confirmed by EDX measurements. However, because these particles accumulate close to edges of the poled region, they do not affect the central portion where the graphene device is fabricated.

Figure 9:
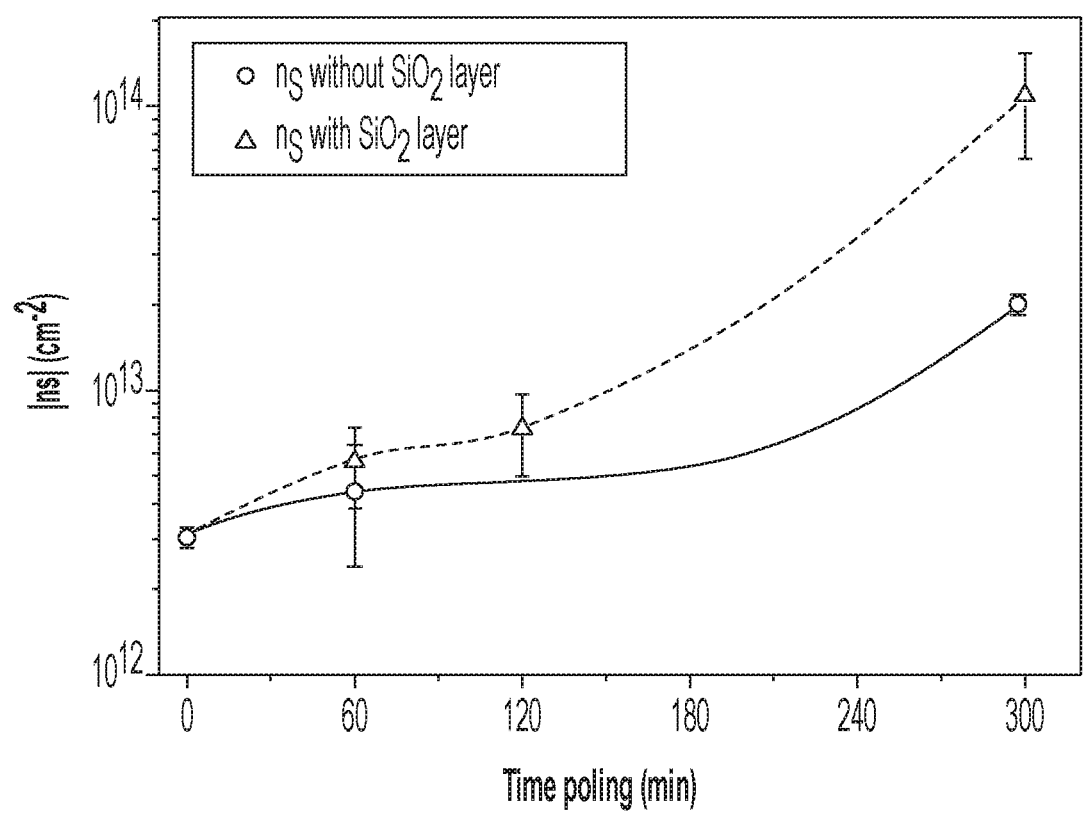
FIG. 9 illustrates a plot of carrier density ($n_S$) measured on graphene devices after thermal poling glass substrates at various times, according to some embodiments.

FIG. 9 illustrates a plot of carrier density ($n_S$) measured on graphene devices after thermal poling glass substrates at various times, according to some embodiments. In other words, FIG. 9 shows the evolution of graphene doping with poling time. As poling time increases, the difference in doping of graphene between samples with a blocking layer and without a blocking layer widens, as exemplified by the widening gap in carrier density. Thus, different doping levels may be achieved when blocking layers are deposited between the SDG surface and the graphene device. Moreover, poling is enhanced when a blocking layer is included. In FIG. 9, graphene doping of the sample including the blocking layer increases from about $10^{12}$ $cm^{-2}$ (for non-poled SDG) to $10^{14}$ $cm^{-2}$ (for poled SDG). This confirms the contribution of the blocking layer in enhancing graphene doping while preserving its quality in the fabrication procedure.

Thus, as presented herein, improved graphene stacked structures and methods of fabricating thereof whereby an external electric field $V_P$ is applied to accumulate a strong positive charge close to the device, thus inducing a stronger doping effect in graphene in the presence of a blocking layer on a glass substrate face where the graphene device is located. The blocking layer enhances the poling effect avoiding the complete neutralization of Na in the cathode, thus accumulating a greater positive charge inside the glass. This allows preservation of graphene quality, as neutralized powder complexes are not deposited at the glass-graphene interface, which can potentially break or damage the material. Moreover, the contention of Na inside the glass avoid deposition of particles between the glass and graphene that may create detrimental residues on the glass surface, the graphene and the devices using them.

If the blocking layer is placed between the glass surface and the anodic electrode, it may increase the strength of the frozen-in field of the depletion region as it does not allow positive charges (e.g., ions) to penetrate from the otherwise non-blocking anode into the depletion region causing reduction of space charge. Where graphene is also placed at the anodic side over the blocking layer, the doping of graphene may increase due to the stronger frozen-in electric field in the depletion layer. If the blocking layer is placed on both anodic and cathodic sides, it may even increase further its effects.

The present disclosure includes glass substrates that may be thermally poled, blocking layers for the mobile ions and at least one graphene layer or graphene multilayer. The present disclosure also includes methods of inducing doping in the at least one graphene layer through thermal poling, with such doping effects enhanced by the presence of a blocking layer. The present disclosure also includes device using the disclosed structure design.

Advantages include: (1) control of intrinsic doping to graphene layers; (2) compatibility with encapsulated graphene devices; (3) possibility to reduce the temperature and voltage conditions of poling; (4) preservation of graphene quality by adding the blocking layer; and (5) potential stability of the graphene doping over time due to thermal poling permanence.

As utilized herein, the terms "approximately," "about," "substantially," and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

As utilized herein, "optional," "optionally," or the like are intended to mean that the subsequently described event or circumstance can or cannot occur, and that the description includes instances where the event or circumstance occurs and instances where it does not occur. The indefinite article "a" or "an" and its corresponding definite article "the" as used herein means at least one, or one or more, unless specified otherwise.

References herein to the positions of elements (e.g., "top," "bottom," "above," "below," etc.) are merely used to describe the orientation of various elements in the FIGURES. It should be noted that the orientation of various elements may differ according to other exemplary embodiments, and that such variations are intended to be encompassed by the present disclosure.

With respect to the use of substantially any plural and/or singular terms herein, those having skill in the art can translate from the plural to the singular and/or from the singular to the plural as is appropriate to the context and/or application. The various singular/plural permutations may be expressly set forth herein for the sake of clarity.

It will be apparent to those skilled in the art that various modifications and variations can be made without departing from the spirit or scope of the claimed subject matter. Accordingly, the claimed subject matter is not to be restricted except in light of the attached claims and their equivalents.

What is claimed is:

1. A method of forming a graphene device, comprising:
   providing a glass substrate with at least one blocking layer disposed thereon to form a stack, wherein the glass substrate comprises metal ions;
   providing a first electrode disposed to partially cover the blocking layer;
   transferring a graphene layer on the first electrode;
   providing a second electrode disposed to partially cover the blocking layer without overlapping with the first electrode and the graphene layer;
   increasing the temperature of the stack to at least 100° C.;
   applying an external electric potential ($V_{P2}$) to the first electrode such that said metal ions of the glass substrate migrate toward the first electrode to create a depletion region in the glass substrate adjacent the second electrode at a potential ($V_{P1}$);
   decreasing the temperature of the stack to room temperature while applying the external electric potential; and
   after reaching room temperature, setting the external electric potential to zero to create a frozen voltage region in the glass substrate adjacent the second electrode.

2. The method of claim 1, wherein the stack includes the blocking layer disposed between the glass substrate and at least one graphene layer.

3. The method of claim 2, wherein the at least one graphene layer is an n-type graphene layer.

4. The method of claim 1, wherein the first electrode is a cathode electrode, the second electrode is an anode electrode, and the external electric potential is negative.

5. The method of claim 1, wherein the blocking layer is disposed adjacent to the first electrode or adjacent to the second electrode.

6. The method of claim 1, wherein the blocking layer is disposed adjacent to the first electrode and adjacent to the second electrode.

7. The method of claim 1, wherein:
   the at least one metal ion comprises at least one of sodium ions, calcium ions, lead ions, lithium ions, potassium ions, boron ions, zirconium ions, titanium ions, magnesium ions, aluminum ions, or barium ions, and
   the step of applying the external electric potential further comprises:
      reacting the at least one metal ion at the first electrode to form a powder complex.

8. The method of claim 7, wherein the powder complex comprises at least one of $Na_2O$, $Na_2CO_3$, $CaO$, $PbO$, $LizO$, $K_2O$, $B_2O_3$, $ZrO_2$, $TiO_2$, $MgO$, $Al_2O_3$, or $BaO$.

9. The method of claim 1, wherein the blocking layer comprises at least one of a $SiO_2$ layer, a hydrophobic coating, a polyimide layer, a self-assembly polymer monolayer, an ion exchanged glass, or combinations thereof.

10. The method of claim 1, wherein a thickness of the blocking layer is in a range of 1 nm to 100 nm.

11. The method of claim 1, wherein a thickness of the depletion region is at least 4 µm.

12. The method of claim 1, wherein the step of applying the external electric potential to the first electrode comprises:
   increasing a thickness of the depletion region.

13. The method of claim 1, wherein the external electric potential is in a range of 100 V to 10 kV.

14. The method of claim 1, further comprising:
   after the step of setting the external electric potential to zero, annealing the stack to eliminate the frozen voltage region.

15. The method of claim 1, wherein the step of increasing the temperature comprises:
   increasing the temperature of the stack to a range of 100° C. to 300° C.

16. The method of claim 1, wherein the potential ($V_{P1}$) is 0 V.

17. The method of claim 1, wherein the method further comprises providing a dielectric layer disposed on the graphene layer.

18. The method of claim 1, wherein the first electrode comprises a Hall bar geometry area.

19. The method of claim 18, wherein the method further comprises removing graphene beyond the Hall bar geometry area by wet etching.

20. The method of claim 1, wherein the blocking layer comprises $Al_2O_3$, $SiO_2$, a hydrophobic coating, ion exchanged glass, or combinations thereof.

* * * * *